(12) United States Patent
Im et al.

(10) Patent No.: US 12,002,918 B2
(45) Date of Patent: Jun. 4, 2024

(54) DISPLAY MODULE AND DISPLAY APPARATUS HAVING THE SAME

(71) Applicant: SAMSUNG ELECTRONICS CO., LTD., Suwon-si (KR)

(72) Inventors: Sangkyun Im, Suwon-si (KR); Joowhan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 419 days.

(21) Appl. No.: 17/561,328

(22) Filed: Dec. 23, 2021

(65) Prior Publication Data

US 2022/0231211 A1  Jul. 21, 2022

Related U.S. Application Data

(63) Continuation of application No. PCT/KR2021/001289, filed on Feb. 1, 2021.

(30) Foreign Application Priority Data

Jan. 15, 2021  (KR) .................. 10-2021-0006297

(51) Int. Cl.
*H01L 33/64*   (2010.01)
*H01L 25/075*  (2006.01)
(Continued)

(52) U.S. Cl.
CPC ........ *H01L 33/647* (2013.01); *H01L 25/0753* (2013.01); *H01L 25/13* (2013.01);
(Continued)

(58) Field of Classification Search
CPC ... H01L 33/647; H01L 25/0753; H01L 25/13; H01L 25/167; H01L 33/62; H01L 33/641; H01L 33/642
See application file for complete search history.

(56) References Cited

U.S. PATENT DOCUMENTS

| 8,471,479 B2 | 6/2013 | Tomiyoshi |
| 8,702,262 B2 | 4/2014 | Park et al. |

(Continued)

FOREIGN PATENT DOCUMENTS

| JP | 2008-66454 A | 3/2008 |
| KR | 10-0646545 B1 | 11/2006 |

(Continued)

OTHER PUBLICATIONS

International Search Report (PCT/ISA/210) issued Oct. 8, 2021 by the International Searching Authority in International Patent Application No. PCT/KR2021/001289.

(Continued)

*Primary Examiner* — J. E. Schoenholtz
(74) *Attorney, Agent, or Firm* — Sughrue Mion, PLLC

(57) ABSTRACT

A display module includes a substrate, a ground layer disposed in the substrate, a plurality of self-emissive devices provided on a front surface of the substrate, a first driver integrated circuit (IC) provided on a rear surface of the substrate, and a first heat dissipation structure connected to the ground layer, and including a first ground pad exposed to the rear surface of the substrate. The first heat dissipation structure is configured to dissipate heat to the rear surface of the substrate.

20 Claims, 11 Drawing Sheets

(51) Int. Cl.
  *H01L 25/13* (2006.01)
  *H01L 25/16* (2023.01)
  *H01L 33/62* (2010.01)
(52) U.S. Cl.
  CPC ............ *H01L 25/167* (2013.01); *H01L 33/62* (2013.01); *H01L 33/641* (2013.01)

(56) References Cited

U.S. PATENT DOCUMENTS

| | | |
|---|---|---|
| 9,417,494 B2 | 8/2016 | Kim et al. |
| 11,540,430 B2 | 12/2022 | Ha |
| 2007/0052335 A1 | 3/2007 | Shin |
| 2010/0073914 A1 | 3/2010 | Park et al. |
| 2013/0162506 A1 | 6/2013 | Kim et al. |
| 2014/0300872 A1 | 10/2014 | Kim et al. |
| 2020/0350476 A1 | 11/2020 | Lee et al. |
| 2021/0066270 A1* | 3/2021 | Hsieh .................... H05B 45/20 |
| 2021/0111326 A1* | 4/2021 | Shiau .................... H01L 33/641 |
| 2021/0204455 A1 | 7/2021 | Ha |
| 2022/0068898 A1* | 3/2022 | Xu .......................... H01L 24/33 |
| 2022/0150629 A1 | 5/2022 | Choi et al. |

FOREIGN PATENT DOCUMENTS

| | | |
|---|---|---|
| KR | 10-2010-0033726 A | 3/2010 |
| KR | 10-2010-0046042 A | 5/2010 |
| KR | 10-1257789 B1 | 4/2013 |
| KR | 10-2013-0073816 A | 7/2013 |
| KR | 10-2014-0121525 A | 10/2014 |
| KR | 10-1751109 B1 | 6/2017 |
| KR | 10-2018-0062320 A | 6/2018 |
| KR | 10-2020-0064928 A | 6/2020 |
| KR | 10-2020-0127815 A | 11/2020 |
| KR | 10-2021-0082933 A | 7/2021 |

OTHER PUBLICATIONS

Written Opinion (PCT/ISA/237) issued Oct. 8, 2021 by the International Searching Authority in International Patent Application No. PCT/KR2021/001289.

* cited by examiner

DISPLAY MODULE AND DISPLAY APPARATUS HAVING THE SAME

CROSS REFERENCE TO RELATED APPLICATIONS

This application is a by-pass continuation of International Application No. PCT/KR2021/001289, filed on Feb. 1, 2021 in the Korean Intellectual Property Receiving Office, which is based on and claims priority to Korean Patent Application No. 10-2021-0006297, filed on Jan. 15, 2021 in the Korean Intellectual Property Office, the disclosures of which are incorporated by reference herein in their entirety.

BACKGROUND

1. Field

The disclosure relates to a display module and a display apparatus having the same.

2. Description of Related Art

Display devices, in line with the continuous development direction of high luminance, high resolution, and large-scale display devices, have recently been demanded due to their high efficiency, low power consumption, etc., according to the trend of eco-electronics.

As a new display device for replacing a liquid crystal display (LCD) panel, an organic light emitting diodes (OLEDs) display panel attracts attention, but high price, large size, and reliability issues according to a low yield rate are issues to be addressed.

There is an increase in the attention to a technique that directly mounts an LED emitting red, green, and blue on a substrate, as a new product to replace or supplement the foregoing.

The display device may display an image without a backlight by applying a self-emissive display element, and express various colors while an operation is performed in units of pixels or sub-pixels. An operation of each pixel or sub-pixel is controlled by a thin film transistor (TFT).

SUMMARY

Provided are a display module with a heat dissipation structure and a display device including the same that prevents heat generated from a plurality of driver integrated circuits (ICs) corresponding to hot spots placed on a back of a substrate from being conducted to the front (e.g., the screen side) of a display module.

Additional aspects will be set forth in part in the description which follows and, in part, will be apparent from the description, or may be learned by practice of the presented embodiments.

According to an aspect of the disclosure, a display module may include a substrate, a ground layer disposed in the substrate, a plurality of self-emissive devices provided on a front surface of the substrate, a first driver integrated circuit (IC) provided on a rear surface of the substrate, and a first heat dissipation structure connected to the ground layer, and including a first ground pad exposed to the rear surface of the substrate. The first heat dissipation structure is configured to dissipate heat to the rear surface of the substrate.

The ground layer may be connected to the first ground pad.

The first ground pad may be provided adjacent to the first driver IC. The first heat dissipation structure may include a first heat transfer member including a surface in contact with the first ground pad and a first heat dissipation member in contact with a side of the first heat transfer member, and configured to dissipate heat transferred through the first heat transfer member.

The first heat transfer member may include a thermal interface material (TIM), and the first heat dissipation member may include graphite.

The first heat dissipation member may be configured to overlap the first driver IC.

The first heat dissipation member is of a height that may be about the same as the first driver IC.

The display module may include a second driver IC disposed in the rear surface of the substrate and adjacent to the first driver IC. The first ground pad may be disposed between the first driver IC and the second driver IC.

The display module may include a second heat dissipation structure provided on the rear surface of the substrate. The second heat dissipation structure may include second ground pad disposed between a third driver IC and a fourth driver IC that is adjacent to the third driver IC, and connected to the ground layer, a second heat transfer member including a surface in contact with the second ground pad, and a second heat dissipation member in contact with a side of the second heat transfer member.

The display module may further include a second heat transfer member including a surface in contact with a second ground pad. The second heat transfer member is in contact with the first heat dissipation member and the first heat transfer member.

The display module may further include an under-fill member disposed between the rear surface of the substrate and the first driver IC, where the under-fill member may include a material configured for heat absorption.

The display module may further include an under-fill member disposed between the rear surface of the substrate and the first driver IC, where the under-fill member may include a material configured for insulation.

The display module may further include an adhesive member provided on a side surface of the first driver IC in a closed loop shape and between a lower surface of the first driver IC and the rear surface of the substrate, where an air gap may be formed between the lower surface of the first driver IC and the rear surface of the substrate.

According to an aspect of the disclosure, a display apparatus may include a support panel, and a plurality of display modules provided on a surface of the support panel. Each display module may include a thin film transistor (TFT) substrate, a micro light emitting diode (LED) provided on a front surface of the TFT substrate, a driver IC provided on a rear surface of the TFT substrate, and a heat dissipation structure connected to a ground layer disposed in the TFT substrate and including a ground pad exposed to the rear surface of the TFT substrate. The heat dissipation structure may be configured to dissipate heat to the rear surface of the TFT substrate.

The ground pad may be provided adjacent to the driver IC, and the heat dissipation structure may include a heat transfer member comprising a surface in contact with the ground pad, the heat transfer member including TIMs, and a heat dissipation member in contact with a side of the heat transfer member. The heat dissipation member may be configured to dissipate heat transferred through the heat transfer member, and the heat dissipation member may include graphite.

The display apparatus may include an under-fill member disposed between the rear surface of the TFT substrate and the driver IC, where the under-fill member may include a material configured for heat absorption.

The display apparatus may include an under-fill member disposed between the rear surface of the TFT substrate and the driver IC, where the under-fill member may include a material configured for insulation.

The heat dissipation member may be configured to overlap the driver IC.

The heat dissipation member may be of a height that is about the same as the driver IC.

The ground layer may be connected to the ground pad.

The display apparatus may include an adhesive member provided on a side surface of the driver IC in a closed loop shape and between a lower surface of the driver IC and the rear surface of the TFT substrate, where an air gap may be formed between the lower surface of the driver IC and the rear surface of the TFT substrate.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
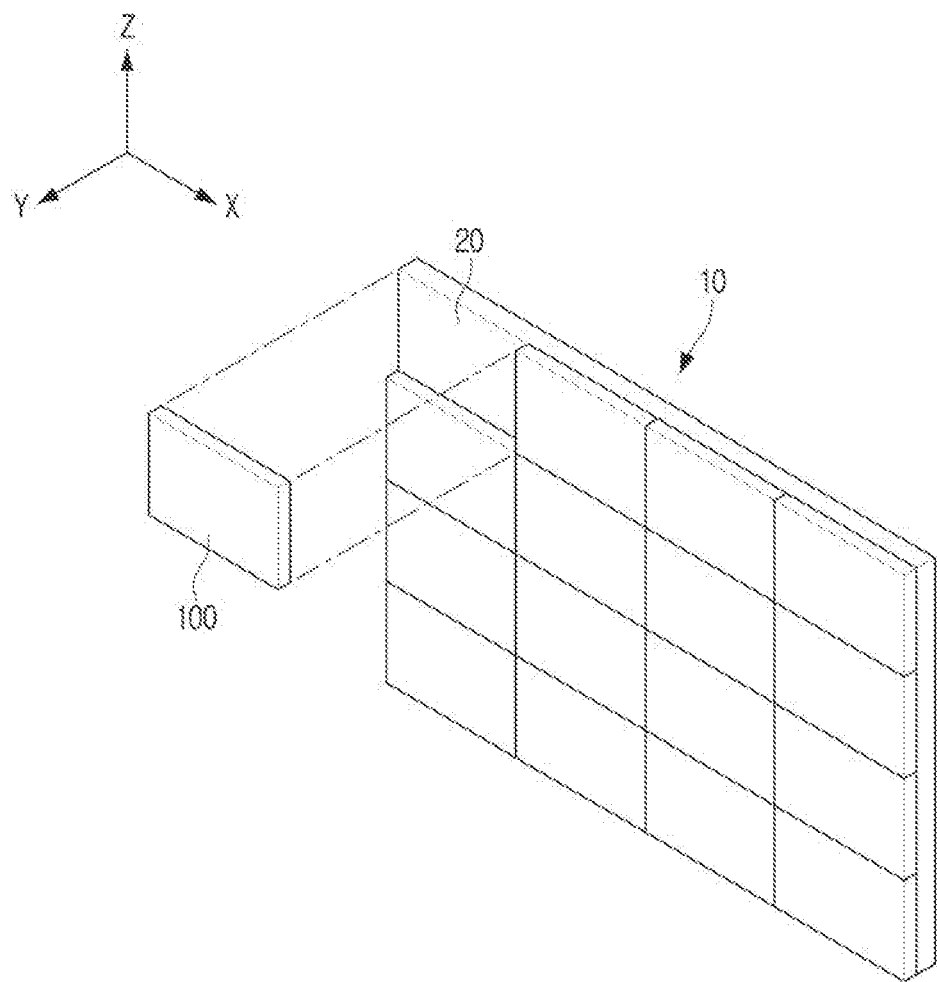
FIG. 1 is a diagram illustrating a display apparatus according to an embodiment of the disclosure.

Hereinafter, various embodiments will be described in detail with reference to the accompanying drawings. The embodiments described herein may be variously modified. Certain embodiments may be described in the drawings and described in detail in the detailed description. However, the specific embodiments disclosed in the accompanying drawings are to facilitate understanding various embodiments. Accordingly, it is to be understood that the present invention is not limited to the specific embodiments disclosed in the accompanying drawings, and it is to be understood that all equivalents or alternatives included within the spirit and scope of the invention are included.

In this disclosure, the terms first, second, etc. may be used to describe various components, but these components are not limited by the terms discussed above. The terms described above are used only to distinguish one component from another component.

It is to be understood that the terms such as "comprise" may, for example, be used to designate a presence of a characteristic, number, step, operation, element, component, or a combination thereof, and not to preclude a presence or a possibility of adding one or more of other characteristics, numbers, steps, operations, elements, components or a combination thereof. It should be understood that, while certain components are "connected" or "coupled" to other components, they may be directly connected to or coupled to the other components, or other components may be present therebetween. On the other hand, when certain components are referred to as being "directly connected" or "directly coupled" to other components, it should be understood that there are no other components therebetween.

In the disclosure, "the same" may refer to components that are matched as well as those that can be different within an extent of the processing error range.

When it is decided that a detailed description for the known art related to the disclosure may unnecessarily obscure the gist of the disclosure, the detailed description may be shortened or omitted.

A display module may include a display panel with a self-emissive device for displaying a plurality of images. The display module may be one of a flat panel display panel including a plurality of inorganic LEDs, each of which may be about 100 micrometers or below, providing better contrast, response time and energy efficiency compared to liquid crystal display (LCD) panels that require backlight.

In the disclosure, a light emitting device for displaying an image provided in a display module may refer to a light emitting diode (LED) having a size of 100 nm or less, which is an inorganic light emitting device. In the disclosure, the LED may be, for example, a mini LED not more than 50 μm, or a micro LED of not more than 30 μm which is smaller than the mini LED. Hereinafter, a micro-inorganic light emitting device provided in a display module of the disclosure is referred to as an "LED".

The LED of the disclosure has brightness, luminous efficiency, and lifetime longer than the organic LED (OLED). The LED may be a semiconductor chip capable of emitting light by itself when power is supplied. The LED has a fast reaction rate, low power, and high luminance. For example, the LED has a higher efficiency for converting electricity to photons compared to an existing LCD or an OLED display. That is, the "brightness per Watt" is greater as compared to existing LCD or OLED displays. The LED of the disclosure may provide the same brightness while consuming less (e.g., substantially half) energy as the existing LED (e.g., an LED having a horizontal, vertical, and height exceeding 100 μm, respectively) or OLED. In addition to the foregoing, the LEDs of the disclosure are capable of providing high resolution, outstanding color, contrast and brightness, may accurately provide a wide range of colors, and may provide a clear screen even in the outdoors under direct and bright sunlight. In addition, the LEDs of the disclosure are resistant to burn-in phenomenon, and generate less heat, thereby improving product lifespan and reducing deformation. The LEDs of the disclosure may have a flip-chip structure in which an anode electrode and a cathode electrode are formed on the same first surface and a light emitting surface is formed on a second surface opposite to a first surface on which the electrodes are formed.

The substrate may be disposed with a thin film transistor (TFT)layer formed of a TFT circuit on the front surface, and a power supply circuit to supply power to the TFT circuit and data driving driver, a gate drive driver and a timing controller to control each drive driver may be disposed on a rear surface. A plurality of pixels arranged in the TFT layer may be driven by a TFT circuit. The driving drivers may be bonded directly to the substrate through a chip on board (COB) bonding method. The COB bonding method may refer to a case where the substrate is formed of a synthetic resin. The driving drivers may also be bonded directly to the TFT substrate through a chip on glass (COG) bonding method. In this disclosure, the substrate of the synthetic resin may be, for example, a substrate including materials such as Polyimide (PI), Polyethylene Terephthalate (PET), Polyethersulfone (PES), Polyethylene Naphthalate (PEN), Polycarbonate (PC), or the like. In some cases, the substrate may use a glass substrate or a ceramic substrate.

A TFT layer formed with a TFT circuit may be disposed on a front surface of the substrate, and a circuit may not be disposed on a rear surface of the substrate. The TFT layer may be integrally formed on the substrate or may be manufactured in a separate film form to be attached to one surface of the glass substrate.

The edge region of the substrate may be the outermost region of the glass substrate. The edge region of the substrate may be a remaining region except for the region in which the circuit of the substrate is formed. The edge region of the substrate may also include a portion of the front surface of the substrate adjacent to the side of the substrate and a rear surface of the substrate adjacent to the side of the substrate. The substrate may be formed of a quadrangle type. The substrate may be formed of rectangle or square. The edge region of the substrate may include at least one of four sides of the glass substrate.

According to various embodiments, the TFT forming the TFT layer (or the backplane) is not limited to a specific structure or type. In other words, the TFT may be implemented as a low temperature poly silicon (LTPS) TFT, an oxide TFT, a poly silicon or a-silicon TFT, an organic TFT, and a graphene TFT, or the like, and may be applied to a P type (or N-type) MOSFET in a Si wafer CMOS process.

The pixel driving method of the display module may be an active matrix (AM) driving method or a passive matrix (PM) driving method. The display module may form a pattern of wiring in which each LED is electrically connected according to an AM driving method or a PM driving method.

A plurality of pulse amplitude modulation (PAM) control circuits may be arranged in a pixel region. In this example, each sub-pixel disposed in a pixel region may be controlled by a corresponding PAM control circuit. A plurality of pulse width modulation (PWM) control circuits may be disposed in a pixel region. In this example, each sub-pixel disposed in a pixel region may be controlled by a corresponding PWM control circuit.

A plurality of PAM control circuits and a plurality of PWM control circuits may be arranged in a pixel area. Some of the subpixels arranged in a pixel region may be controlled by the PAM control circuit and the remainder may be controlled through the PWM control circuit. Each sub-pixel may also be controlled by a PAM control circuit and a PWM control circuit.

The display module for implementing bezel-less may provide a large-sized multi-display device capable of maximizing an active area when a plurality of displays are connected. Each display module may be configured to maintain a pitch between each of the pixels of the adjacent display module equal to a pitch between each of the pixels in a single display module as the inactive area is minimized. Accordingly, this may be a method in which a seam is not visible in the connection portion between the display modules.

The display module may be installed and applied to wearable devices, portable devices, handheld devices in a single unit, and electronic products or electronic parts requiring various displays, and may be applied to display devices such as monitors for personal computer (PC), high-resolution televisions (TVs) and signage (or digital signage), electronic displays, etc. through a plurality of assembly layouts, as a matrix type.

Hereinafter, the display module according to an embodiment will be described.

FIG. 1 is a diagram illustrating a display apparatus according to an embodiment.

Referring to FIG. 1, a display device 10 according to one embodiment of the disclosure may connect a plurality of display modules 100 to implement a large size screen, and may include a support panel 20 in which each display module 100 is mounted in a detachable manner.

The plurality of display modules 100 may be continuously mounted in a row direction and a column direction on the support panel 20. The display modules 100 adjacent to each other may be physically and electrically connected through the support panel 20.

The support panel 20 may be provided with a power supply circuit for supplying power to each display module 100.

The display device 10 may form a square of which width to length is the same or a rectangle of which width to length is different, depending on the arrangement of the plurality of display modules 100.

Figure 2:
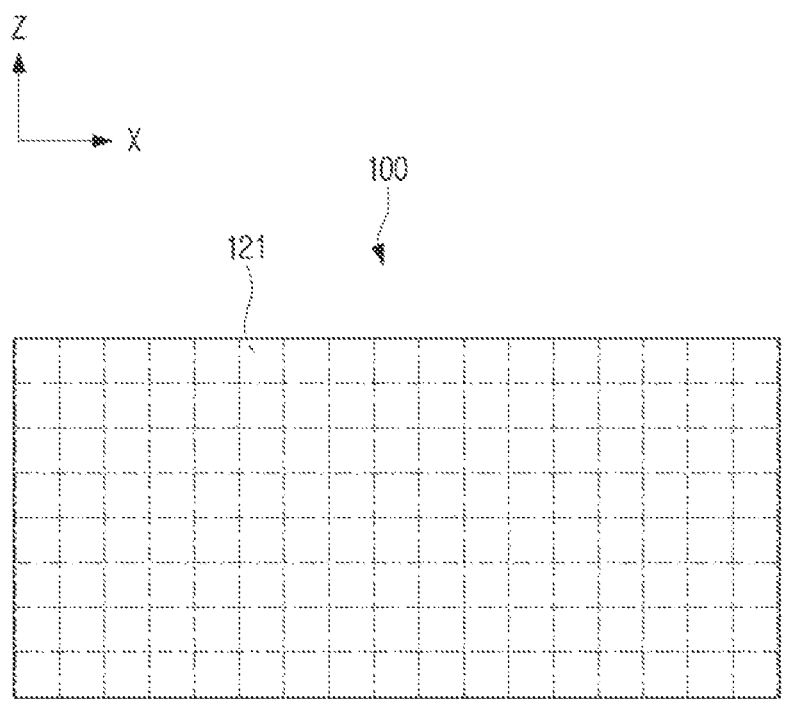
FIG. 2 is a diagram illustrating a display module of a display apparatus according to an embodiment of the disclosure.
Figure 3:
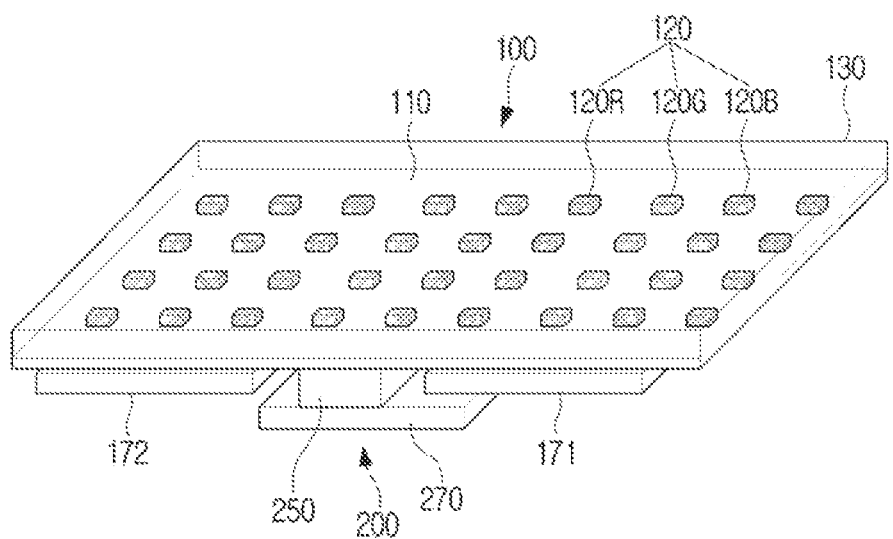
FIG. 3 is a diagram illustrating a display module of a display apparatus according to an embodiment of the disclosure.

FIG. 2 is a diagram illustrating a display module of a display apparatus according to an embodiment. FIG. 3 is a diagram illustrating a display module of a display apparatus according to an embodiment.

"LED" may refer to an inorganic light emitting device for displaying an image in the size of 100 μm or below, and, in some embodiments, a mini LED having a size of less than or equal to 50 μm, or a micro LED of a size of 30 μm or less, smaller than a mini LED.

Referring to FIGS. 2 and 3, the display module 100 may include a substrate 110 and a plurality of LED 120 (120R, 120G, and 120B) (e.g., micro LEDs) for displaying images arranged on the substrate 110. Since the plurality of LEDs 120 (120R, 120G, and 120B) are self-emissive devices, there is no need for a separate backlight.

The substrate 110 may be a TFT substrate including a TFT circuit on a front surface. The TFT circuit may be formed on one surface of the glass substrate or the plastic substrate.

The substrate 110 may include a plurality of driver integrated circuits (ICs) (e.g., 171, 172, 173, and 174 of FIG. 5) that supply power to the TFT circuit and are electrically connected with a separate control board placed on a rear surface.

The substrate 110 may include an active area to express an image on a front surface.

The active area may be partitioned into a plurality of pixel areas 121, each of which is arranged with a plurality of pixels. The plurality of pixel regions 121 may be divided into various shapes, and may be divided into a matrix. Each pixel region 121 may include a sub-pixel region on which a plurality of sub-pixels are mounted, and a pixel circuit region in which a pixel circuit for driving each sub-pixel is disposed.

The plurality of LEDs 120 (120R, 120G, and 120B) may be transferred to the pixel circuit area of the TFT layer, and the electrode pads of each micro LED may be electrically connected to the substrate electrode pads formed in the sub-pixel area of the TFT layer.

The plurality of substrate electrode pads are electrically connected to a plurality of LEDs 120 (120R, 120G, and 120B). The plurality of LEDs 120 (120R, 120G, and 120B) may be connected to the TFT circuit through a plurality of substrate electrode pads.

The common electrode pad may be formed in a linear shape in consideration of the arrangement of at least three LEDs (e.g., 120R, 120G, and 120B) located in each pixel area. The plurality of LEDs 120 (120R, 120G, and 120B) are subpixels emitting light of red, green, and blue wavelengths, respectively, and may form one pixel 120.

"One micro LED" may refer to an LED having a size of 100 μm or less, which is an inorganic light-emitting device. For example, the micro LED may refer to a mini LED having a size less than or equal to about 50 μm or a micro LED having a size of about 30 μm or less, smaller than the mini LED. The micro LED may refer to "one sub-pixel", and the corresponding term may be interchangeably used.

A red, green, and blue LED 120R, 120G, and 120B, respectively, are described as forming one pixel 120, but the embodiment is not limited thereto and two or four LEDs may form one pixel.

The pixel driving method of the display module 100 according to an embodiment of the disclosure may be an AM driving method or a PM driving method. The display module 100 may form a pattern of wiring in which each LED is electrically connected according to an AM driving method or a PM driving method.

The front surface 111 (FIG. 4) of the substrate 110 may be laminated with a transparent layer 130 to protect a plurality of LEDs 120 (120R, 120G, and 120B) from contamination caused by foreign objects, external shocks, or the like.

The transparent layer 130 may be formed of a transparent material that does not affect or minimize effect on light emission of a plurality of LEDs 120 (120R, 120G, and 120B), which are light-emissive devices.

Figure 4:
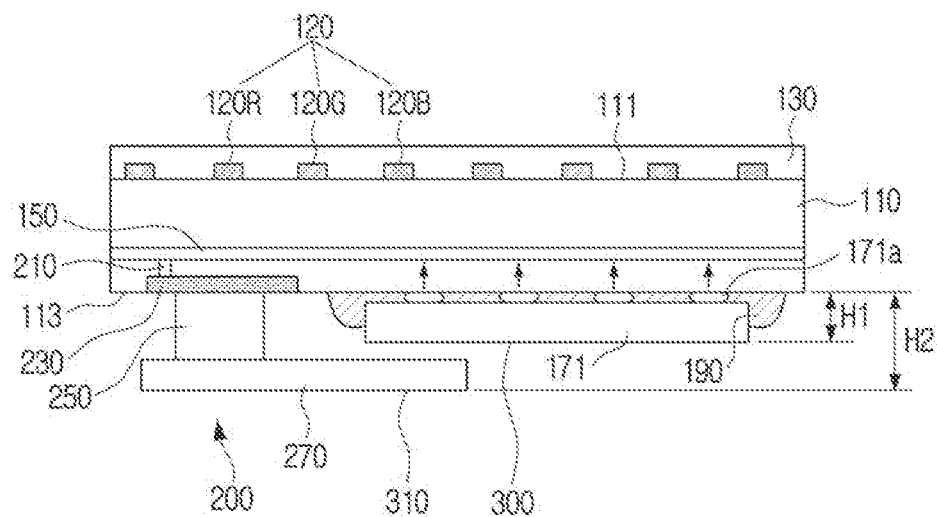
FIG. 4 is a diagram illustrating a portion of the display module of FIG. 3 according to an embodiment.
Figure 5:
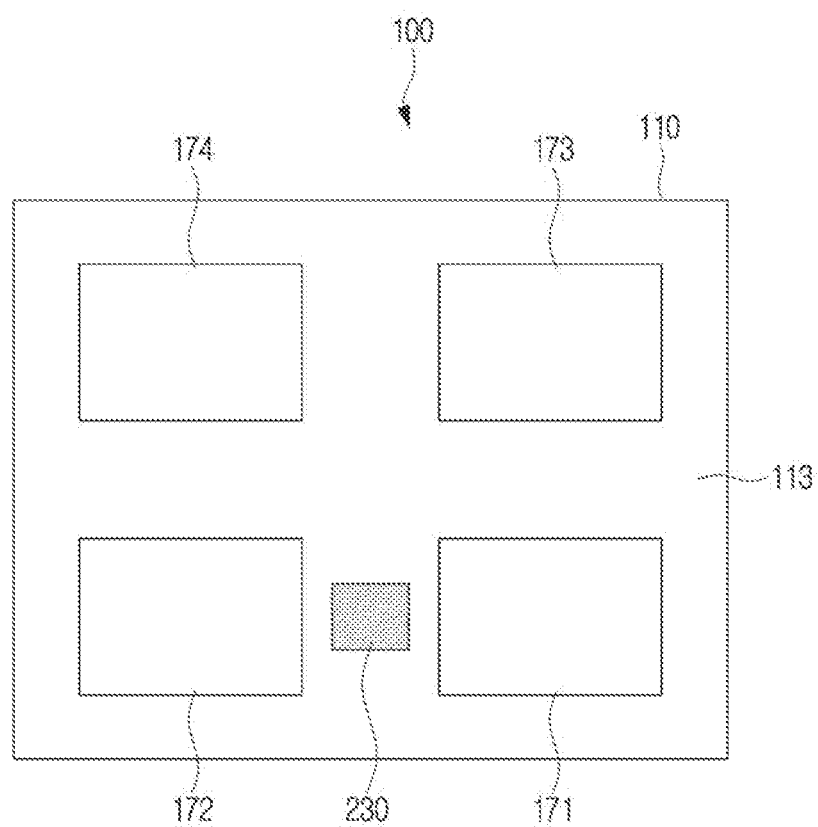
FIG. 5 is a diagram illustrating a rear surface of a display module of a display apparatus showing an example in which a ground pad is exposed to a rear surface of the display module according to an embodiment.
Figure 6:
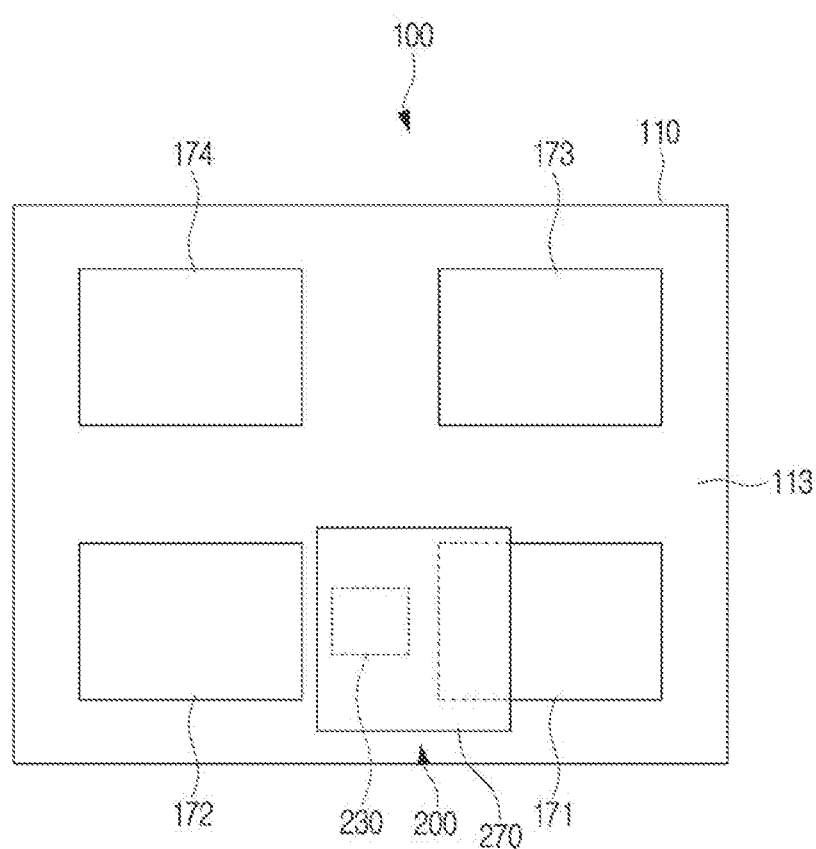
FIG. 6 is a diagram illustrating a display module of a display apparatus according to an embodiment of the disclosure.

FIG. 4 is a diagram illustrating a portion of the display module of FIG. 3 according to an embodiment. FIG. 5 is a diagram illustrating a rear surface of a display module of a display apparatus showing an example in which a ground pad is exposed to a rear surface of the display module according to an embodiment. FIG. 6 is a diagram illustrating a display module of a display apparatus according to an embodiment.

The plurality of driver ICs 171, 172, 173, 174 placed on the rear surface 113 of the substrate 110 may correspond to hot spots having a high heat dissipation in the display module 100. The display module 100 may have a heat dissipation structure 200 that can minimize the heat generated by a plurality of driver ICs 171, 172, 173, and 174 being emitted to the front of the display module 100.

The heat dissipation structure 200 provided in the display module 100 will be described with reference to drawings.

The heat dissipation structure 200 disposed on the rear surface of the display module 100 may include a ground pad 230, a heat transfer member 250, and a heat dissipation member 270.

The ground pad 230 may be exposed to the rear surface 113 of the substrate 110 and may be connected to a ground layer 150 through a via-wiring 210 formed in a via-hole. The ground pad 230 may be made of the same metal material as the ground layer 150.

The ground pad 230 of which a surface exposed to the outside may be located on the same plane as the rear surface 113 of the substrate 110. Accordingly, the ground pad 230 may be formed on the substrate 110 such that a part other than the exposed surface is inserted into the substrate 110.

A plurality of ground layers may be disposed on the substrate 110. The plurality of ground layers may be interconnected the via-wirings. In this example, the ground layer 150 connected to the ground pad 230 may be a ground layer closest to the rear surface 113 of the substrate 110.

The ground pad 230 may be disposed most adjacent to the driver IC 171 corresponding to the hot spot. The arrangement of the ground pads 230 is considered to be capable of directly absorbing the heat conducted along the rear surface 113 of the substrate 110 to the ground pad 230 by generating the ground pad 230 in the driver IC 171.

The ground pad 230 may be disposed between the two driver ICs 171 and 172 as shown in FIG. 5. Accordingly, the ground pad 230 may be disposed adjacent to the two driver ICs 171 and 172.

The space of the ground pad 230 may be formed to be greater than or equal to the space of the surface in contact with the heat transfer member 250.

The ground pad 230 is illustrated as square but the embodiment is not limited thereto and may be formed in various forms such as polygonal, round, oval, or the like.

The heat transfer member 250 may be formed of a composite material with excellent thermal conductivity. For example, the heat transfer member 250 may be thermal interface materials (TIM).

The heat transfer member 250 transfers, to the heat dissipation member 270, the heat conducted from the ground layer 150 to the ground pad 230. The heat transfer member 250 may have both surfaces disposed at opposite sides being in close contact with the ground pad 230 and the heat dissipation member 270. The heat transfer member 250 may prevent voids from being formed at the interface between the ground pad 230 and the interface between the heat dissipation member 270, thereby maximizing thermal conduction efficiency by minimizing the thermal contact resistance caused by voids.

The heat dissipation member 270 may be formed in an approximate plate shape. The heat dissipation member 270 may be formed of graphite.

The thermal conductivity of the graphite is twice that of iron at room temperature, one-third of the copper, two-third of the aluminum, which is very high, and the thermal expansion rate is significantly less than that of iron, copper, aluminum, and ceramic so as to have an optimal condition of heat dissipation.

Referring to FIG. 4, the heat dissipation member 270 may be supported by the heat transfer member 250 and may be disposed at a second protruding height H2 that is higher than the first protruding height H1 of the driver IC 171 (e.g., H1<H2). The first protruding height H1 may be the height from the rear surface 113 of the substrate 110 to the upper surface 300 of the driver IC 171, and the second protruding height H2 may be the height from the rear surface 113 of the substrate 110 to the upper surface 310 of the heat dissipation member 270.

As described above, since the second protrusion height H2 of the heat dissipation member 270 is higher than the first protruding height H1 of the driver IC 171, as shown in FIG. 6, the heat dissipation member 270 may overlap at least a portion of the driver IC 171. Accordingly, the heat-dissipation member 270 may not be interfered by the driver IC 171, thereby securing a wide heating area.

The heat dissipation member 270 is approximately illustrated as square shape, but the embodiment is not limited thereto, and the heat dissipation member 270 may be formed in various shapes in consideration of surrounding structures.

The second protruding height H2 of the heat dissipation member 270 may be determined by the thickness of the heat transfer member 250. When the heat dissipation member 270 is overlapped with the driver IC 171, if the thickness of the heat dissipation member 250 is adjusted, the heat dissipation member 270 may be spaced apart from the upper surface 300 of the driver IC 171 at a predetermined interval, or may be in contact with the upper surface 300 of the driver IC 171, as shown in FIG. 4.

A substantial portion of the total heat emitted from the driver IC 171 may be absorbed into the ground layer 150 through a plurality of ball grids 171a, and the remaining heat may be emitted to the top and side of the driver IC 171. In this example, the heat emitted to the upper surface 300 and the side surface of the driver IC 171 may be directly absorbed into the heat dissipation member 270 overlapping the driver IC 171.

The thermal conductivity path through which heat generated from the driver IC 171 is discharged through the heat dissipation member 270 is as follows.

When the driver IC 171 is driven, the heat generated by the driver IC 171 is conducted through a plurality of ball grids 171a to the inside of the substrate 110 in the direction shown in FIG. 4. The heat conducted through the plurality of ball grids 171a is mostly absorbed into the ground layer 150 that is disposed closes to the plurality of ball grids 171a on the back surface 113 of the substrate 110. The heat absorbed to the ground layer 150 is conducted to the ground pad 230 through the via-wiring 210, and then is conducted to the heat dissipation member 270 through the heat transfer member 250. The heat dissipation member 270 emits heat to the air by convection current.

When the heat dissipation member 270 is in contact with or adjacent to the peripheral structure, some of the heat emitted from the heat dissipation member 270 may be absorbed into the periphery structure.

As described above, the heat emitted from the driver IC 171 is discharged to the rear side of the display module 100 by the heat dissipation structure provided on the rear surface of the substrate 110, thereby fundamentally preventing heat from being emitted to the front (screen side) of the display module 100. The display device 10 according to the disclosure may satisfy the conditions of the home TV used indoors.

Figure 7:
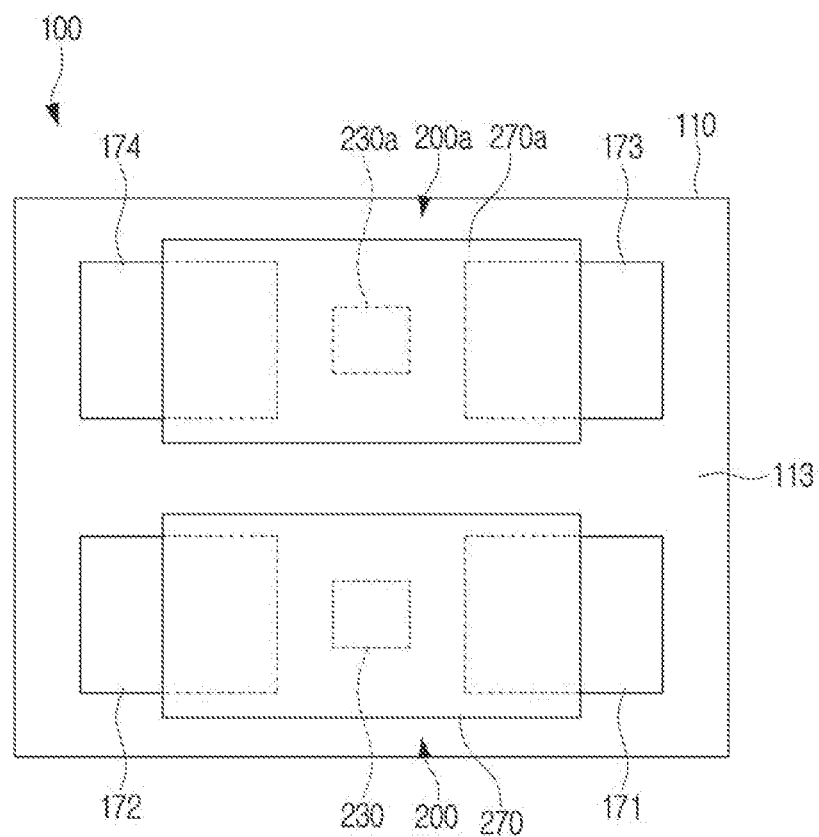
FIG. 7 is a diagram illustrating an example of a heat dissipation structure disposed on a rear surface of a display module of a display apparatus according to an embodiment of the disclosure.

FIG. 7 is a diagram illustrating an example of a heat dissipation structure disposed on a rear surface of a display module of a display apparatus according to an embodiment.

A plurality of heat dissipation structures may be disposed on the rear surface 113 of the substrate 110.

Referring to FIG. 7, the heat dissipation structure 200 is disposed between the first and second driver ICs 171 and 172, and the additional heat dissipation structure 200a may be disposed between the third and fourth driver ICs 173 and 174.

The ground pad 230 of the heat dissipation structure 200 is disposed between the first and second driver ICs 171 and 172 so as to be adjacent to the first and second driver ICs 171 and 172, respectively. The heat dissipation member 270 may be formed so that both sides overlap a portion of the first and second driver ICs 171 and 172, respectively. The heat dissipation member 270 may be connected to the ground pad 230 through a heat transfer member.

The additional heat dissipation structure 200a may include the same structure as the first heat dissipation structure 200. The ground pad 230a of the additional heat dissipation structure 200a is disposed between the first and second driver ICs 171 and 172 to be adjacent to the first and second driver ICs 171 and 172, respectively. The ground pad 230a may be connected to a ground layer disposed closest to the rear surface 113 of the substrate 110 through a via-wiring.

The heat dissipation member 270a may be formed to overlap a portion of the third and fourth driver ICs 173 and 174, respectively. The heat dissipation member 270a may be connected to the ground pad 230a through a heat transfer member.

Figure 8:
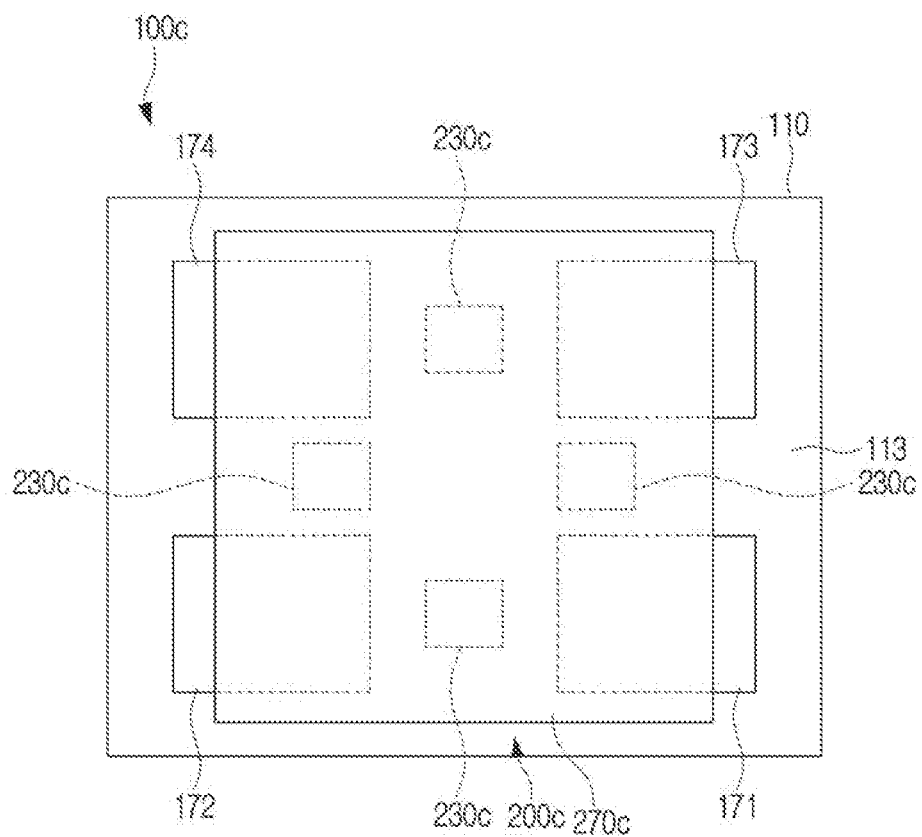
FIG. 8 is a diagram illustrating an example of the heat dissipation structure disposed on a rear surface of a display module of a display apparatus according to an embodiment of the disclosure.

FIG. 8 is a diagram illustrating an example of the heat dissipation structure disposed on a rear surface of a display module of a display apparatus according to an embodiment.

A heat dissipation structure is provided in which a plurality of exposed ground pads are disposed on the rear surface 113 of the substrate 110, and a plurality of ground pads are connected to one heat dissipation member through a plurality of heat dissipation member.

Referring to FIG. 8, the heat dissipation structure 200c may include a plurality of ground pads 230c, a plurality of heat transfer members corresponding to each ground pad 230c, and one heat dissipation member 270c connected to the plurality of heat transfer members.

The four ground pads 230c may be disposed between the four driver ICs 171, 172, 173, and 174. As shown in FIG. 8, each ground pad 230c may be disposed between a pair of driver ICs adjacent to each other. Each ground pad 230c may be connected to a ground layer disposed closest to the back surface 113 of the substrate 110 through a via-wiring.

The one heat dissipation member 270c may overlap one portion of the four driver ICs 171, 172, 173, and 174, respectively. The heat dissipation member 270c may have a larger heating area than the heat dissipation members 270 and 270a described above.

Referring to FIG. 4, an under-fill member 190 is filled between the rear surface 113 of the substrate 110 and the driver ICs 171, 172, 173, and 174 to be protected from external physical impact and moisture.

The material of the under-fill member 190 may be changed to prevent the heat emitted from the respective driver IC's 171, 172, 173, and 174 from being conducted to the front side of the substrate 110.

For example, when the under-fill member 190 is applied with a material having heat absorption, heat emitted from the plurality of ball grids 171a may be mostly absorbed to the under-fill member 190 and then discharged to the air around the driver IC 171 by convection.

In addition, when the under-fill member 190 is applied with a material having insulation, heat conducted to the substrate 110 through the plurality of ball grids 171a may be minimized by the under-fill member 190.

Figure 9:
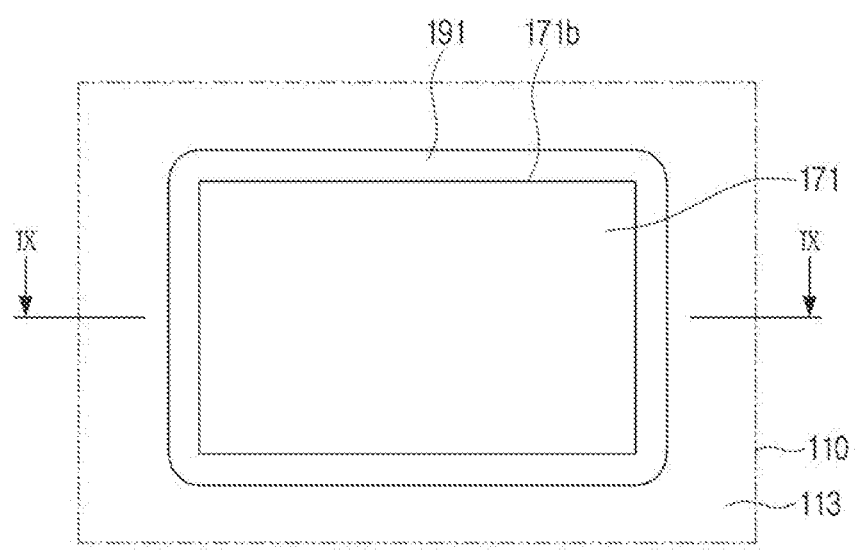
FIG. 9 is a diagram illustrating an example of forming an insulation structure using an air gap between a substrate and a driver integrated circuit (IC) according to an embodiment.
Figure 10:
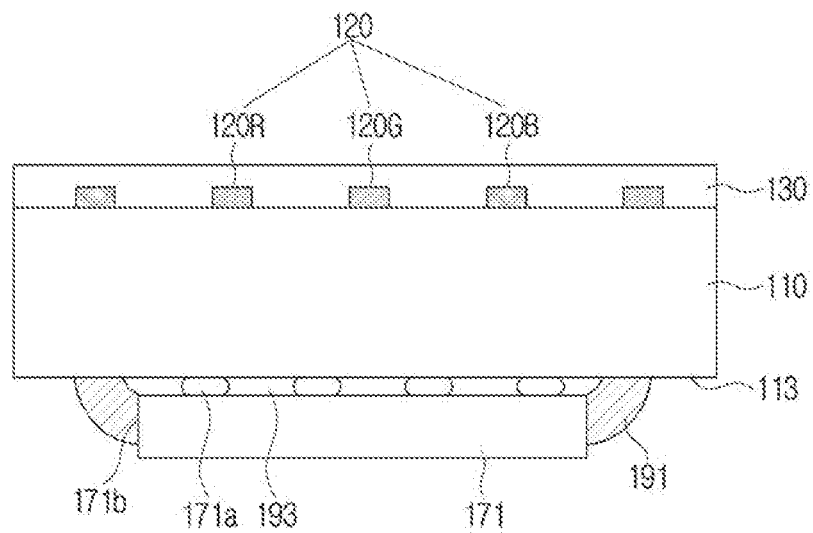
FIG. 10 is a diagram illustrating a view taken along IX-IX line of FIG. 9 according to an embodiment.

FIG. 9 is a diagram illustrating an example of forming an insulation structure using an air gap between a substrate and a driver integrated circuit (IC) according to an embodiment. FIG. 10 is a diagram illustrating a view taken along IX-IX line of FIG. 9 according to an embodiment.

Referring to FIGS. 9 and 10, as an additional heat dissipation structure, an adhesive member 191 that may replace the under-fill member may be provided and an air gap 193 may be formed between the driver IC 171 and the rear surface 113 of the substrate 110.

As shown in FIG. 9, the adhesive member 191 may be formed in a closed loop shape so as to surround the side surface 171b of the driver IC 171. The adhesive member 191 is formed to surround the side surface 171b of the driver IC 171 in the form of a closed loop, thereby sealing between the bottom surface of the driver IC 171 (facing the rear surface of the substrate) and the rear surface 113 of the substrate 110. Accordingly, the adhesive member 191 may protect the rear surface 113 of the substrate 110 and the driver IC 171 from external physical impact and moisture, or the like.

The adhesive member 191 may fix the driver IC 171 to the rear surface 113 of the substrate 110 stably. The adhesive member 191 may have a predetermined flexibility and insulation.

The air gap 193 formed between the driver IC 171 and the rear surface 113 of the substrate 110 may serve as an insulating layer for blocking heat generated by the driver IC 171. Accordingly, it is possible to minimize the heat generated by the driver IC 171 from being conducted to the front of the substrate 110.

The heat dissipation structure 200 described above has a second protruding height H2 of the heat dissipation member 270 higher than the first protruding height H1 of the driver IC 171. The protruding height of the heat dissipation member 270 may not be limited thereto.

Figure 11:
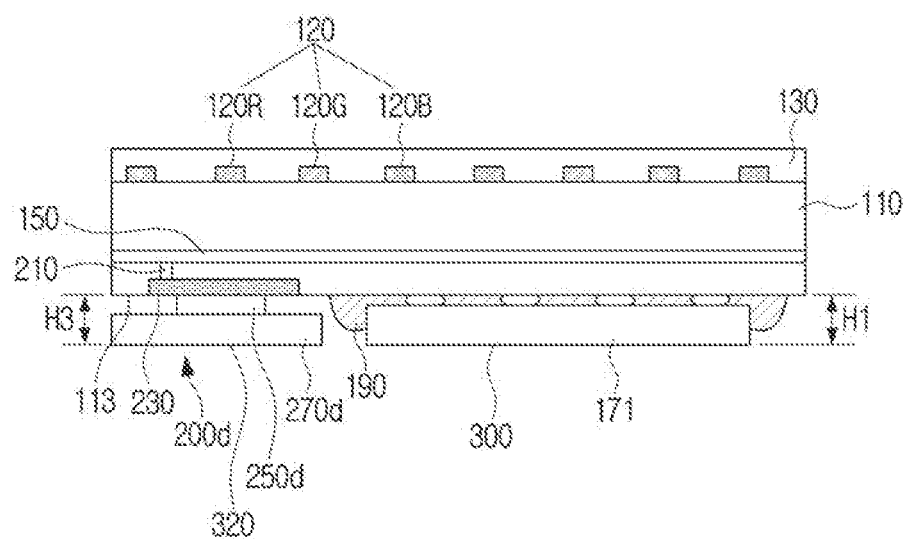
FIG. 11 is a diagram illustrating an example in which a protruding height of a driver IC and heat dissipation member disposed on the rear surface of the substrate are the same according to an embodiment.

FIG. 11 is a diagram illustrating an example in which a protruding height of a driver IC and heat dissipation member disposed on the rear surface of the substrate are the same according to an embodiment.

Referring to FIG. 11, a heat dissipation structure 200d disposed on the rear surface 113 of the substrate 110 may have a third protruding height H3 of the heat dissipation member 270d equal to the first protruding height H1 of the driver IC 171.

The first protruding height H1 may be the height from the rear surface 113 of the substrate 110 to the upper surface 300 of the driver IC 171, and the third protruding height H3 may be the height from the rear surface 113 of the substrate 110 to the upper surface 320 of the heat dissipation member 270d. The upper surface 300 of the driver IC 171 and the upper surface 320 of the heat dissipation member 270d may be located on the same plane.

The third protruding height H3 of the heat dissipation member 270d may be adjusted by forming the thickness of the heat transfer member 250D thinner than the thickness of the heat transfer member 250 (FIG. 4) described above.

When the third protruding height H3 of the heat dissipation member 270d is formed to be equal to the first protruding height H1 of the driver IC 171, the thickness of the display module 100 may be reduced.

As described above, the heat generated from the plurality of driver ICs 171, 172, 173, and 174 corresponding to the hot spot through the heat dissipation structure formed on the rear surface 113 of the substrate 110 may be prevented from being conducted to the front (e.g., screen side) of the display module 100 or minimized.

The various embodiments have been described individually, but it is not necessary that each embodiment is implemented as a sole embodiment, but configurations and operations of each embodiment may be implemented in combination with at least one other embodiment.

While preferred embodiments of the disclosure have been shown and described, the disclosure is not limited to the aforementioned specific embodiments, and it is apparent that various modifications can be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A display module comprising:
   a substrate;
   a ground layer provided in the substrate;
   a plurality of self-emissive devices provided on a front surface of the substrate;
   a first driver integrated circuit (IC) provided on a rear surface of the substrate; and
   a first heat dissipation structure connected to the ground layer, and comprising a first ground pad exposed to the rear surface of the substrate,
   wherein the first heat dissipation structure is configured to dissipate heat to the rear surface of the substrate.

2. The display module of claim 1, wherein the ground layer is connected to the first ground pad.

3. The display module of claim 1, wherein the first ground pad is adjacent to the first driver IC, and
   wherein the first heat dissipation structure comprises:
   a first heat transfer member having a first surface that contacts the first ground pad; and
   a first heat dissipation member that contacts a second surface of the first heat transfer member, and is configured to dissipate heat transferred through the first heat transfer member.

4. The display module of claim 3, wherein the first heat transfer member comprises a thermal interface material (TIM), and
   wherein the first heat dissipation member comprises graphite.

5. The display module of claim 3, wherein the first heat dissipation member overlaps the first driver IC.

6. The display module of claim 3, wherein a height of the first heat dissipation member is approximately the same as a height of the first driver IC.

7. The display module of claim 3, further comprising a plurality of driver ICs including the first driver IC and a second driver ID that is provided in the rear surface of the substrate and adjacent to the first driver IC, and
   wherein the first ground pad is provided between the first driver IC and the second driver IC.

8. The display module of claim 7, further comprising:
   a second heat dissipation structure provided on the rear surface of the substrate,
   wherein the second heat dissipation structure comprises:
   a second ground pad provided between a third driver IC and a fourth driver IC of the plurality of driver ICs, the third driver IC and the fourth driver IC being adjacent to each other, the second ground pad being connected to the ground layer;
   a second heat transfer member having a first surface that contacts the second ground pad; and
   a second heat dissipation member that contacts a second surface of the second heat transfer member.

9. The display module of claim 7, further comprising a second heat transfer member having a surface that contacts a second ground pad,
wherein the second heat transfer member contacts the first heat dissipation member and the first heat transfer member.

10. The display module of claim 1, further comprising:
an under-fill member provided between the rear surface of the substrate and the first driver IC,
wherein the under-fill member comprises a material configured for heat absorption.

11. The display module of claim 1, further comprising:
an under-fill member provided between the rear surface of the substrate and the first driver IC,
wherein the under-fill member comprises a material configured for insulation.

12. The display module of claim 1, further comprising:
an adhesive member provided on a side surface of the first driver IC in a closed loop shape and between a lower surface of the first driver IC and the rear surface of the substrate, and
wherein an air gap is provided between the lower surface of the first driver IC and the rear surface of the substrate.

13. A display apparatus comprising:
a support panel; and
a plurality of display modules provided on a surface of the support panel,
wherein each display module of the plurality of display modules comprises:
a thin film transistor (TFT) substrate;
a ground layer provided in the TFT substrate;
a micro light emitting diode (LED) provided on a front surface of the TFT substrate;
a driver integrated circuit (IC) provided on a rear surface of the TFT substrate; and
a heat dissipation structure connected to the ground layer and comprising a ground pad exposed to the rear surface of the TFT substrate,
wherein the heat dissipation structure is configured to dissipate heat to the rear surface of the TFT substrate.

14. The display apparatus of claim 13, wherein the ground pad is adjacent to the driver IC,
wherein the heat dissipation structure further comprises:
a heat transfer member comprising a surface in contact with the ground pad, the heat transfer member comprising thermal interface materials (TIM); and
a heat dissipation member in contact with a side of the heat transfer member,
wherein the heat dissipation member is configured to dissipate heat transferred through the heat transfer member, and
wherein the heat dissipation member comprises graphite.

15. The display apparatus of claim 14, wherein each display module of the plurality of display modules further comprises:
an under-fill member provided between the rear surface of the TFT substrate and the driver IC,
wherein the under-fill member comprises a material configured for heat absorption.

16. The display apparatus of claim 14, wherein each display module of the plurality of display modules further comprises:
an under-fill member disposed between the rear surface of the TFT substrate and the driver IC,
wherein the under-fill member comprises a material configured for insulation.

17. The display apparatus of claim 14, wherein the heat dissipation member overlaps the driver IC.

18. The display apparatus of claim 14, wherein a height of the heat dissipation member is approximately the same as a height of the driver IC.

19. The display apparatus of claim 13, wherein the ground layer is connected to the ground pad.

20. The display apparatus of claim 13, wherein each display module of the plurality of display modules further comprises:
an adhesive member provided on a side surface of the driver IC in a closed loop shape and between a lower surface of the driver IC and the rear surface of the TFT substrate, and
wherein an air gap is provided between the lower surface of the driver IC and the rear surface of the TFT substrate.

* * * * *